United States Patent [19]

Kobayashi et al.

[11] Patent Number: 4,573,782
[45] Date of Patent: Mar. 4, 1986

[54] DEVELOPING APPARATUS FOR FORMING AN IMAGE IN LIGHT-SENSITIVE MATERIAL USING PHOTOPOLYMERIZABLE COMPOSITION

[75] Inventors: Kesanao Kobayashi; Tadao Toyama; Susumu Yoshida, all of Shizuoka, Japan

[73] Assignee: Fuji Photo Film Co., Ltd., Kanagawa, Japan

[21] Appl. No.: 444,142

[22] Filed: Nov. 24, 1982

[30] Foreign Application Priority Data

Nov. 24, 1981 [JP] Japan .............................. 56-188246

[51] Int. Cl.$^4$ .............................................. G03D 3/08
[52] U.S. Cl. ................................. 354/299; 354/319; 354/325; 118/641; 430/330
[58] Field of Search ............... 354/299, 317, 318, 319, 354/325; 118/641, 642; 430/330, 328

[56] References Cited

U.S. PATENT DOCUMENTS

| | | | |
|---|---|---|---|
| 2,555,874 | 6/1951 | Coughlin | 354/317 |
| 3,059,560 | 10/1962 | Gutzmer | 354/325 |
| 3,589,261 | 6/1971 | Krikelis | 354/325 |
| 4,215,927 | 8/1980 | Grant et al. | 354/317 |
| 4,334,755 | 6/1982 | Harrel et al. | 354/299 |
| 4,421,844 | 12/1983 | Buhr et al. | 430/330 |

Primary Examiner—A. A. Mathews
Attorney, Agent, or Firm—Sughrue, Mion, Zinn, Macpeak, and Seas

[57] ABSTRACT

A method for forming an image on a light-sensitive material with a light-sensitive layer composed of a photopolymerizable composition, and an apparatus for carrying out the method are described. This method comprises exposing imagewise, heating, and developing a number of light-sensitive materials while the time interval between the heating and developing steps is maintained at a definite level. Changes in sensitivity of the light sensitive material are prevented and images of high sensitivity are obtained.

15 Claims, 2 Drawing Figures

DEVELOPING APPARATUS FOR FORMING AN IMAGE IN LIGHT-SENSITIVE MATERIAL USING PHOTOPOLYMERIZABLE COMPOSITION

FIELD OF THE INVENTION

The present invention relates to a method of forming an image in a light-sensitive material having a photopolymerizable light-sensitive layer, and a developing apparatus. More particularly, it relates to a method of forming an image wherein a heating step is interposed between an exposure step and a developing step, and a developing apparatus suitable for use in the method.

BACKGROUND OF THE INVENTION

It is known that a light-sensitive material using a photopolymerizable composition is sensitized by heating after it is exposed. This sensitization by heating usually occurs in the solid phase, increasing the sensitivity to from several to several ten times the original value. An advantage of increasing the sensitivity by heating resides in that exposure time can be shortened, increasing an operation efficiency and at the same time, making it possible to save energy. When the sensitivity of the light-sensitive material is markedly increased, it can be subjected to enlarged exposure and further, it is possible to apply scanning exposure using laser.

Another advantage is that it is possible to utilize a photopolymerization initiator which is of low sensitivity, has good stability, and is inexpensive. This permits the production of a light-sensitive material which has good stability and is inexpensive.

Incorporation, on the other hand, of such a heating step into the plate making process increases the number of steps and makes the process complicated. In particular, problems arise in processing a large number of light-sensitive materials. It has been found that a definite time interval between the heating and the developing steps of a light-sensitive material is important. It has also been found that sensitivity is quite different between when the light-sensitive material is developed immediately after it is heated and when a number of light-sensitive materials are heated and, after heating of all the materials is completed, they are developed.

SUMMARY OF THE INVENTION

An object of the invention is to provide a method of forming an image in a light-sensitive material having a photopolymerizable light-sensitive layer wherein a heating step is provided between an exposure step and a developing step, shortening exposure time.

Another object of the invention is to provide a method of forming an image which makes it possible to prevent changes in sensitivity due to differences in conditions under which the light-sensitive material is stored until it is developed after heating, and which overcomes the problem of increased operation amount involved in incorporating a heating step.

The present invention, in one embodiment, relates to a method of forming an image which comprises exposing imagewise, heating, and developing a number of light-sensitive materials in sequence, said light-sensitive material carrying a light-sensitive layer composed of a photopolymerizable composition, wherein the time interval between said heating and development is maintained at a definite level.

In another embodiment, the present invention relates to an apparatus for developing light-sensitive materials which include a light-sensitive layer composed of a photopolymerizable composition, comprising a roller convey type developing unit and a heating unit fitted to the developing unit. The heating unit being provided so that a light-sensitive layer exposed to a light is heated and then the light-sensitive material is sent to the roller convey type developing unit, in a predetermined definite period of time.

DETAILED DESCRIPTION OF THE INVENTION

Figure 1:
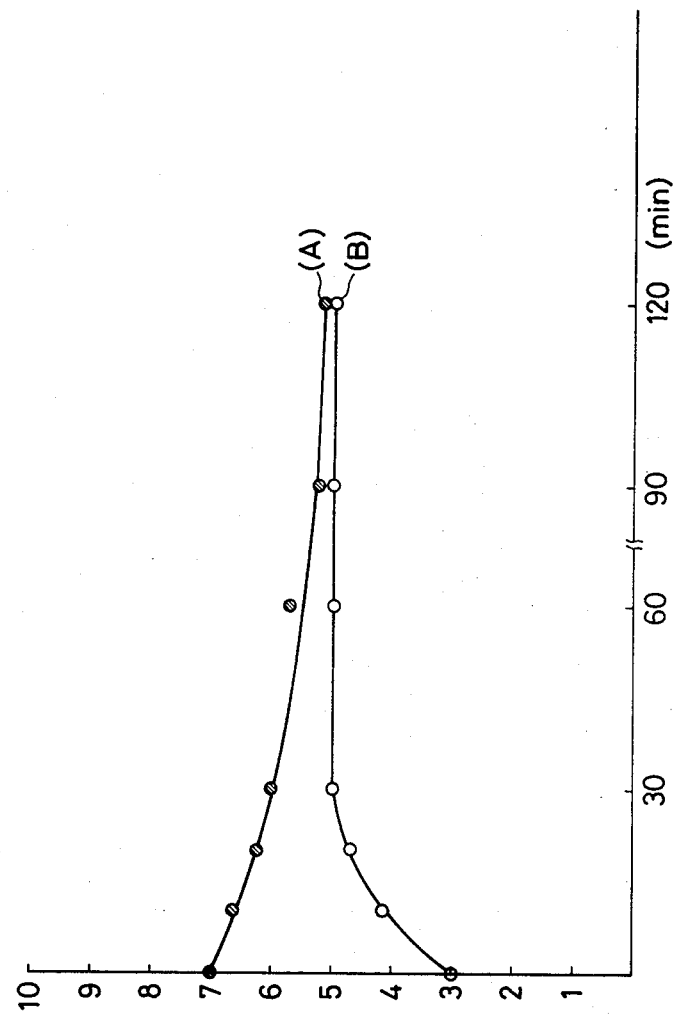
FIG. 1 is a graph showing the relation between sensitivity and the time interval between exposure and development and between heating and development.

The present invention utilizes a processing system in which a heating unit is provided at a point before the exposed light-sensitive materials are introduced into the developing unit of a roller convey type imageforming processing system. That is, in accordance with the invention, the time required for starting development after heating is kept constant, and the number of operations is not increased by the incorporation of a heating unit into an automatic developing machine. When using an automatic developing machine, a heating unit is incorporated into an feeder table for light-sensitive materials, or between the feeder table and a developing unit, and the light-sensitive materials are conveyed at the same speed as the developing machine. Therefore, the exposed light-sensitive materials can be introduced into the developing machine in exactly the same manner as in conventional systems.

The present invention is particularly useful specifically for presensitized lithographic plates carrying a photopolymerizable light-sensitive layer. In this case, the automatic developing machine used may be a plate-making system in which all the steps from exposure to development and gum coating are completely automated, or a developing machine in which the developing and gum coating steps or only the developing step is automated. In each system, a washing step may or may not be provided between the respective steps. Further, as a finishing step, a drying step may or may not be provided. After the developing step, a special step or steps (e.g., a step of controlling the surface) may be provided. Moreover, where a step or steps exerting no adverse influences on development, such as a washing step, or allowing the development to proceed advantageously are provided before the developing step, it is possible to incorporate a heating unit before such steps. A cooling step may be provided between the heating step and the developing step.

In the heating unit of the invention, various heating techniques can be used, including a method in which a plate is directly heated and a method in which the plate is heated by generating therein heat through irradiation with electron rays, high frequency waves or other electromagnetic waves. The former method includes a method in which the plate is heated by bringing its light-sensitive surface into contact with a heated roll containing therein a heater, a method in which the plate is contacted with a heated plate, a method in which a heating source, e.g., a ribbon heater, a seed heater, and an infrared ray heater, is provided near the surface of the plate being conveyed, a method in which heated air is blown onto the plate, and a method in which the plate is dipped in a heated liquid or brought into contact therewith. The heating temperature is effective within the range of 50° to 250° C., and it is preferably from 70° to 180° C. and more preferably from 85° to 150° C. When the heating temperature is lower than 50° C., the effect of increasing sensitivity within the conditions employed is poor, whereas when it is higher than 250° C., there is a danger of generating scumming on non-image areas of the plate by a thermal polymerization of the light-sensitive layer. The heating time is effective within the range of from 1/20 to 30 seconds, and it is preferably from 1/15 to 15 seconds and more preferably from 1/10 to 10 seconds.

The heating time is determined by the speed at which the light-sensitive materials are conveyed by the automatic developing machine. Where the light-sensitive materials are knipped by rollers, the contact width is narrowed and, therefore, the direct heating time is shortened. On the other hand, where irradiation heat utilizing an infrared ray heater, for example, is used, the heating time can be made relatively long by controlling the number of heaters and using a reflection plate.

Figure 2:
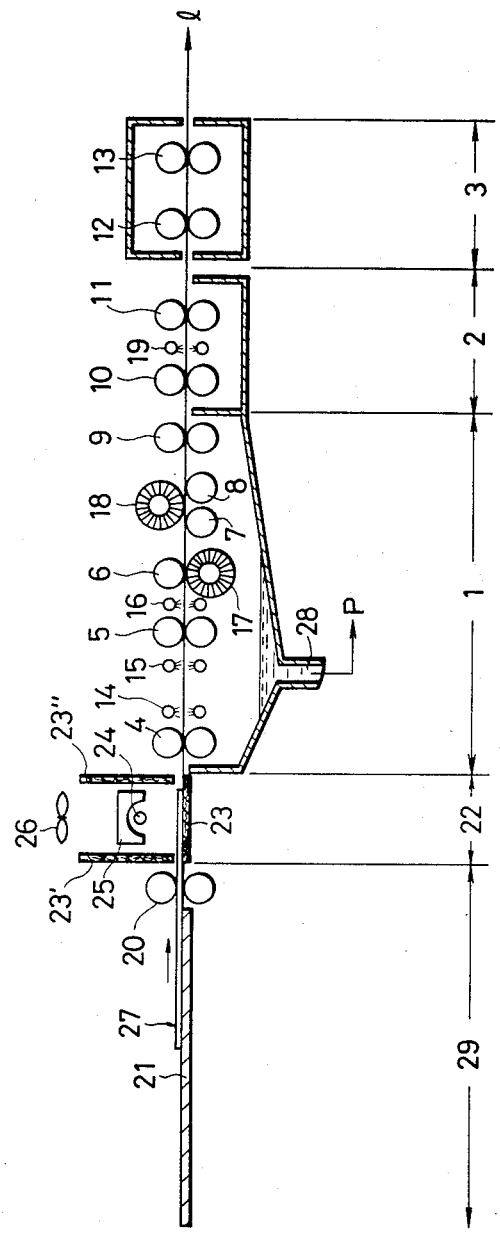
FIG. 2 shows an example of an apparatus of the present invention.

FIG. 2 shows a brief sectional plan of a preferable embodiment of a developing apparatus of the present invention. This developing apparatus comprises a feeder part 29, a heating zone 22, a development zone 1, washing zone 2 and drying zone 3. The feeder part 29 comprises a feeder table 21 and a pair of feed rollers 20. An imagewise exposed light-sensitive material 27 is placed on the feeder table 21, and the front part of the material is inserted to a pair of the feed rollers so that the material is nipped between the rollers. The thus inserted light-sensitive material is conveyed by feed rollers 20 to a heating zone 22 and heat treated. The heating zone 22 is partitioned by a base plate 23 and side plates 23' and 23" made of heat resisting material such as asbestos in order to prevent the heat leaks to outside of the heating zone. In this partition an infrared ray heater 24 is placed and a reflection plate 25 is placed in order to direct the infrared ray emitted from the heater 24 to one direction efficiently. Furthermore, in the heating zone a gas exhaust fan 26 is provided in order to exhaust heated air in the heating zone forcibly.

The light-sensitive material heat treated in the heating zone 22 is successively conveyed to the development zone 1 wherein unexposed areas in the photopolymerizable light-sensitive layer of the light-sensitive material 27 is removed from the material. In the development zone 1 there are a pair of feed rollers 4 and two pairs of conveyor rollers 5 and 9. Among them there are spray pipes 14, 15 and 16, a brush roller 17, a counter roller 6 for the brush roller 17, a brush roller 18, and a counter rollers 7 and 8 for the brush roller 18 are provided. From the developer tank (which is not shown) a developing solution 28 is introduced using a pump p and the developing solution is sprayed to the light-sensitive material 27 vigorously. The brush rollers 17 and 18 are provided in order to remove the non-image areas (i.e. unexposed areas) in the light-sensitive layer of the light-sensitive material which is wetted by the developing solution quickly and completely. These brush rollers rotate at an outer circumference linear speed which is different from the conveying speed of the light-sensitive material. A developing apparatus may not have spray pipes provided beneath the conveying path 1, brush roller 17 and counter roller 6 when a light-sensitive material having a light-sensitive layer only one side of the material is developed.

It is advantageous to raise the nip pressure of a pair of conveyer rollers 9 for reducing the amount of the developing solution adhered to the developed light-sensitive material to thereby prevent the developing solution enters into the washing zone 2.

The developed light-sensitive material is then conveyed to the washing zone 2 wherein the remained developing solution in the material is washed out completely. In the washing zone 2 two pairs of conveyer rollers 10 and 11 are provided and from spray pipes 19 provided between rollers 10 and 11 water is sprayed.

After the washing the light-sensitive material 27 is conveyed to the drying zone 3 and dried. In the drying zone 3 two pairs of conveyer rollers 12 and 13 are provided and hot air is circulated in this zone. For this purpose the heating zone is constructed as a closed room except the conveying path of the light-sensitive material 27.

By using the apparatus of the present invention, the time interval between the heating step and the developing step can be maintained automatically at a definite level so long as a definite conveying speed is kept. Therefore, always definite development results can be obtained.

Photopolymerizable compositions which can be used with this invention will hereinafter be described. These photopolymerizable compositions are composed of binders, addition polymerizable unsaturated monomers, and photopolymerization initiators. Binders which can be used include a methyl acrylate or methacrylate/acrylic or methacrylic acid copolymer, a styrene/maleic anhydride copolymer half ester, a styrene/maleic anhydride copolymer half amide, a benzyl acrylate or methacrylate/acrylic or methacrylic acid copolymer, a benzyl acrylate or methacrylate/itaconic acid copolymer, a styrene/itaconic acid copolymer, a vinyl acetate/crotonic acid copolymer, acidic cellulose phthalate, an acrylic or methacrylic acid/styrene/alkyl acrylate or methacrylate copolymer, and the like.

Useful unsturated monomers are those compounds containing at least one addition polymerizable unsaturated group. Particularly preferred monomers are ethylene glycol diacrylate or dimethacrylate, polyethylene glycol diaccrylate or dimethacrylate, trimethylolethane triacrylate or trimethacrylate, trimethylolpropane triacrylate or trimethacrylate, neopentyl glycol diacrylate or dimethacrylate, pentaerythritol or dipentaerythritol tri, tetra, or hexaacrylate or methacrylate, epoxy diacrylate or dimethacrylate, oligoacrylates as disclosed in Japanese Patent Publication No. 7361/77, acrylurethane resins or acrylurethane oligomers as disclosed in Japanese Patent Publication No. 41708/73, and the like.

Photopolymerization initiators which can be used include vicinal polyketaldonyl compounds as described in U.S. Pat. No. 2,367,660, α-carbonyl compounds as described in U.S. Pat. Nos. 2,367,661 and 2,367,670, acyloin ethers as described in U.S. Pat. No. 2,448,828, α-hydrocarbon-substituted aromatic acyloin compounds as described in U.S. Pat. No. 2,722,512, polynuclear quinone compounds as described in U.S. Pat. Nos. 3,046,127 and 2,951,758, a combination of triarylimidazole dimer and p-aminophenyl ketone as described in U.S. Pat. No. 3,549,367, benzothiazole compounds as described in Japanese Patent Publication No. 48516/76 (corresponding to U.S. Pat. No. 3,870,524,) benzothiazole compounds/trihalomethyl-s-triazine compounds as described in Japanese Patent Application (OPI) No. 74887/79 (the term "OPI" is used herein to mean a "published unexamined Japanese Patent Application) (corresponding to U.S. Pat. No. 4,239,850) and acridine and phenazine compounds as described in U.S. Pat. No. 3,751,259.

The weight ratio of the amount of a binder to the amount of a monomer is 9:1–3:7, preferably 3:1–1:1, and the amount of a photopolymerization initiator is 0.5–15 weight %, preferably 2–10 weight % based on the weight of the total amount of the composition of the light sensitive layer.

It is preferred to further add heat polymerization inhibitors as well as the above-described ingredients. Useful examples of such heat polymerization inhibitors include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol), and 2-mercaptobenzoimidazole. In some cases, dyes or pigments can be added for the coloration of the light-sensitive layer, and pH indicators, etc. can be added as printing-out agents.

Useful examples of supports which can be used in the production of light-sensitive materials include paper, plastics (e.g., polyethylene, polypropylene, polystyrene, polyethylene terephthalate, nylon, and cellulose acetate), materials comprising such plastics and paper bonded together, metallic plates (e.g., aluminum, zinc, and iron), materials comprising such metallic plates and paper, plastics, or the like bonded thereto, and paper or plastic films with metals, for example, vacuum-deposited thereon. This support is selected depending on the purpose for which the ultimate light-sensitive material is used. For example, in the production of a light-sensitive planographic printing plate, an aluminum plate treated by dipping in an aqueous sodium silicate solution as described in U.S. Pat. No. 2,714,066, an aluminum plate subjected to anodic oxidation after graining as described in U.S. Pat. No. 3,181,461, an aluminum plate electrolyzed by alternating current in an electrolytic bath of hydrochloric acid and, thereafter, subjected to anodic oxidation as described in British Pat. No. 1,208,224, and so forth can be used.

Examples of developers include an alkali silicate-containing solution as described in U.S. Pat. No. 3,615,480 and a developer comprised of an alkali, an organic solvent and water as described in U.S. Pat. No. 3,475,171.

The present invention will be now illustrated in more detail by reference to the following examples although it is not limited thereto. All percentages are based on weight unless otherwise indicated.

EXAMPLE 1

A 0.3 mm thick 2S aluminum plate was degreased by soaking in a 10% aqueous solution of sodium triphosphate maintained at 80° C. for 30 seconds. The surface was grained by rubbing with a nylong brush while flowing a pumice slurry on the aluminum plate, etched with sodium aluminate maintained at 60° C. for 10 seconds, and subsequently, washed with a 3% aqueous solution of sodium hydrogensulfate. This aluminum plate was subjected to anodic oxidation in 20% sulfuric acid at a current density of 2 A/dm$^2$ for 2 minutes, treated with a 2.5% aqueous solution of sodium silicate maintained at 70° C. for 1 minute, washed with water, and dried. Subsequently, a light-sensitive solution as described hereinafter was coated on the aluminum plate by means of a whirler and dried at 100° C. for 2 minutes.

| Composition of Light-Sensitive Solution | |
|---|---|
| Methyl methacrylate/methacrylic acid (molar ratio: 85/15; methylethylketone solution; intrinsic viscosity at 30° C.: 0.166) | 48 g |
| Trimethylolpropane triacrylate | 48 g |
| 3-Methyl-2-benzoylmethylenenaphtho-(1,2-d)thiazole | 5 g |
| Phthalocyanine Blue (CI. Blue #15) | 3 g |
| Ethylene dichloride | 500 g |
| Methylcellosolve acetate | 500 g |

After drying, a 3% by weight aqueous solution of polyvinyl alcohol was coated on the above-prepared light-sensitive layer. The dry weights of the light-sensitive layer and the polyvinyl alcohol layer were 3 g/m$^2$ and 1.5 g/m$^2$, respectively.

Light-sensitive planographic printing plates were produced. Each plate was subjected to 30 count exposure through a negative transparency having a half-tone image and a grey scale (presents adjacent to the film) by means of a Nuarc printer (trade name: manufactured by nuArc Company Cop., Chicago, U.S.A.) with a 2 kW metal halide lamp. The density at the first stage of the grey scale (produced by Fuji Photo Film Co., Ltd.) was 0.10 and the density changed 0.15 with every stage. The thus exposed plates were developed by the methods as described hereinafter. In this development, the developing machine used was the same as the machine represented by zones 1, 2 and 3 in FIG. 2 (described in Example 2 in detail). The developing speed was 30 seconds, and a developer having the following composition was used.

| Composition of Developer | |
|---|---|
| Benzyl alcohol | 10 g |
| Monoethanolamine | 1 g |
| Triethanolamine | 10 g |
| Sodium isopropylnaphthalenesulfonate | 2 g |
| Pure water | 1,000 ml |

A heating apparatus having a 10 cm×50 cm sheet-like flexible heater was used. The plates were contacted to the heater and conveyed to the developing machine at a predetermined speed. The linear speed of the machine and heating apparatus were set to 30 cm/min and the contacting time of the plates to the heater was 20 seconds. The temperature of the heater when it was on was controlled so that the temperature of the contacting surface of the plate to the heater was maintained at 80° C. The time interval between the end of the heating and the starting of the development was 10 seconds.

A light sensitive planographic printing plate which had been exposed was processed using the above-described heater (which was on) and machine.

After the development the number of grey scale stages (at the area where boundaries remain) was 7. Ten light-sensitive planographic printing plates were processed in the same manner as described above, and the same number's of stages were obtained.

The same exposed plates were processed in the same manner as described above except that the heater was off. The number of grey scale stages obtained was 3.

The results show that the sensitivity of the printing plate which was heated was 4 times the sensitivity of the printing plate which was not heated.

The heating apparatus was separated from the developed machine. Six light-sensitive planographic printing plates were exposed and heated in the same manner as shown above. Each plate was developed after a lapse of each predetermined time. Another 6 plates were exposed and developed in the same manner as described above after allowing them to stand at room temperature for predetermined periods of times.

The graph of FIG. 1 shows the results obtained above. In the graph the lapse of time is plotted on the abscissa, and the number of solid black of grey scale on the ordinate. Curve (A) indicates the results of the process wherein the heating was carried out; curve (B) indicates the results of the process wherein the heating was not carried out.

From FIG. 1 it can be seen that the sensitivity varies depending on the time interval between heating and development (when heating is carried out) or on the time interval between exposure and development (when heating is not carried out). Therefore, it is recognised that it is necessary to carry out heating and to maintain the time interval between the heating and development at a definite level to obtain a high sensitivity and a definite development result.

EXAMPLE 2

The feeder table of the automatic developing machine (Model 400S, produced by Fuji Photo Film Co., Ltd.) was remodeled as shown in FIG. 2 and used in this example. In this apparatus, a 1 kW infrared ray heater (24) was provided in front of the feed roller (4) at a location 80 mm above the plate (27) surface, and the feeder table (21) and another set of feed rollers (20) were provided in front of the heating apparatus (22) having a length (in the conveying direction) of 150 mm. In the same manner as in Example 1, the number of stages of the grey scale was measured when the infrared ray heater was off, and also when it was on. In the former case (off), the number of stages was 4, whereas in the latter case (on), it was 7.

The same 10 light-sensitive planographic printing plates as used above were exposed and then heated and developed using the apparatus of FIG. 2 in the same manner as the above-described latter case. In all cases the number of stages of the grey scale of this treated plates was 7.

EXAMPLE 3

A 0.24 m/m thick aluminum plate was grained in a 400 mech pumice slurry suspension by means of a nylon brush. The thus grained aluminum plate was dipped in a 10% aqueous solution of sodium hydroxide at 50° C. for 60 seconds to remove an abrasive, aluminum dust, etc. remaining on the aluminum surface after the graining, thereby making the aluminum surface smooth or uniform. The plate was then washed in flowing water, neutralized with 20% nitric acid, and washed with water. The aluminum plate was then subjected to an electrolytic graining treatment utilizing an aqueous solution of nitric acid having a concentration of 7 g/l as an electrolyte and using an alternating waveform current as shown in FIG. 1(b) of Japanese Patent Application (OPI) No. 152302/77 (corresponds to U.S. Pat. No. 4,087,341). This treatment was performed for 5 seconds under the conditions of: frequency=60 Hz, voltage at anode $(V_A)=25$ volts, voltage at cathode $(V_C)=13$ volts, current amount at anode $(Q_C)=176$ coulomb/dm$^2$, and the current amount at cathode $(Q_A)=125$ coulomb/dm$^2$ $(Q_C/Q_A=0.71)$. The thus-treated plate was then washed with water to obtain a substrate (Substrate A).

Substrate A was dipped in a 10% sodium hydroxide solution at 20° C. for 5 seconds to remove smuts from the surface thereof. At this time, the formation of hydrogen gas was not observed. After washing, the substrate was subjected to anodic oxidation in 20% sulfuric acid with a direct current so that a 3.0 g/m$^2$ of oxide film was formed. The substrate was then washed with water and dried. Subsequently, a light-sensitive layer having a composition as described hereinafter was provided on the substrate in a dry weight of 2.5 g/m$^2$.

| Composition of Light-Sensitive Layer | |
|---|---|
| Pentaerythritol tetraacrylate | 10 g |
| Benzyl acrylate/methacrylic acid (80/20) copolymer (molecular weight: about 50,000) | 10 g |
| 2-Benzoylmethylene-3-methyl-β-naphthothiazoline | 0.6 g |
| 2-(p-Methoxyphenyl)-4,6-bis-(trichloromethyl)-s-triazine | 0.6 g |
| Oil Blue #603 (produced by Orient Chemical Industry Ltd.) | 0.2 g |
| Hydroquinone | 0.01 g |
| Methylethylketone | 200 g |
| Methylcellosolve acetate | 200 g |

After the light-sensitive layer was dried, an aqueous solution of polyvinyl alcohol (degree of saponification: 82%; molecular weight: about 500) was coated in a dry coating amount of 1.5 g/m$^2$.

A transparent negative film was placed on the above-prepared plate, and a photographic strobe light (Guide No. 20) placed at a distance of 50 cm from the plate was flashed once. Subsequently, the plate was processed using the same developing machine (remodeled 400S) as used in Example 2. A 3% sodium silicate aqueous solution was used as a developer. Two samples were prepared; Sample No. 1 was passed through the developing machine while the infrared ray lamp was ON, and Sample No. 2, while the infrared ray lamp was OFF. Both of the plates were processed at a conveying speed of 35 cm/min.

These two developed plates were simultaneously mounted on a Heidel GTO (trade name) printing machine manufactured by Heidelberg Co.) and printed. With Sample No. 2, no fine printed matters were obtained, and when several hundred sheets were printed in that poor printing state, the ink could not stick thereto. On the other hand, with Sample No. 1, even after 200,000 sheets were printed, the images were sharp.

The same 10 light-sensitive planographic printing plates as used above were treated in the same manner as that the Sample No. 1. From each plate 200,000 printed sheets having sharp images were obtained.

While the invention has been described in detail and with reference to specific embodiments thereof, it will be apparent to one skilled in the art that various changes and modifications can be made therein without departing from the spirit and scope thereof.

What is claimed is:

1. An apparatus for developing light-sensitive material carrying a light-sensitive layer composed of a photopolymerizable composition, comprising:

a roller convey type developing unit and a heating unit;

said heating unit comprising a means for carrying out a first step of developing;

said heating unit, after said light-sensitive material carrying a light-sensitive layer composed of a photopolymerizable composition has been exposed imagewise to light, provides means to heat said light-sensitive material to further sensitize said light-sensitive material;

wherein after said light-sensitive material is heated to further sensitize said light-sensitive material in said heating unit said light-sensitive material is sent to said roller convey type developing unit in a predetermined period of time.

2. An apparatus for developing light-sensitive materials according to claim 1, wherein said developing unit has an introduction member for the light-sensitive material and the heating unit is incorporated into the introduction member.

3. An apparatus for developing light-sensitive materials according to claim 1, wherein said developing unit has an introduction member for the light-sensitive material and the heating unit is provided between the introduction member and the developing unit.

4. An apparatus for developing light-sensitive materials according to claims 2 or 3, wherein said heating unit functions to convey the light-sensitive material at the same speed as the developing unit.

5. An apparatus for developing light-sensitive material according to claim 1, wherein said heating unit is in an initial process zone and said roller convey type developing unit is in a second process zone.

6. An apparatus for developing light-sensitive material according to claim 1, wherein said roller convey type unit is a means for carrying out a second step of developing.

7. An apparatus for developing light-sensitive material according to claim 1, wherein said photopolymerizable composition is comprised of an addition polymerizable unsaturated monomer, a photopolymerization initiator and a binder.

8. An apparatus for developing light-sensitive material according to claim 1, wherein said heating unit is capable of heating at a temperature from 50°–250° C.

9. An apparatus for developing light-sensitive material according to claim 1, wherein said heating unit is capable of heating for 1/20–30 seconds.

10. An apparatus for developing light-sensitive material according to claim 1, wherein means for a washing step is provided before the developing unit and after the heating unit.

11. An apparatus for developing light-sensitive material according to claim 1, wherein means for a cooling step is provided between said heating unit and said developing unit.

12. An apparatus for developing light-sensitive material according to claim 7, wherein the weight ratio of the binder to the amount of monomer is 9:1–3:7.

13. An apparatus for developing light-sensitive material according to claim 7, wherein the amount of photopolymerization initiator is 0.5–15 wt%.

14. An apparatus as claimed in claim 1, wherein said apparatus does not contain means for applying a developing ink to an imagewise exposed light-sensitive layer.

15. An apparatus for developing light-sensitive material as claimed in claim 1, wherein said apparatus does not contain a means for applying ink to an imagewise exposed light-sensitive layer prior to said heating unit.

* * * * *